United States Patent [19]

Lee et al.

[11] Patent Number: 5,315,601
[45] Date of Patent: May 24, 1994

[54] ERROR CORRECTION METHOD AND APPARATUS THEREOF

[75] Inventors: Man-young Lee; Hak-song Park, both of Seoul; Young-cheol Kim; Tae-yong Kim, both of Incheon; Yong-jin Choi; Jae-moon Kim, both of Seoul, all of Rep. of Korea

[73] Assignee: Samsung Electronics Co., Ltd., Kyunggi-do, Rep. of Korea

[21] Appl. No.: 707,811

[22] Filed: May 30, 1991

[30] Foreign Application Priority Data

Jan. 31, 1991 [KR] Rep. of Korea .................. 91-1859

[51] Int. Cl.$^5$ .......................................... G06F 11/10
[52] U.S. Cl. ................................................ 371/39.1
[58] Field of Search ................... 371/37.1, 37.4, 37.5, 371/38.1, 39.1, 40.1

[56] References Cited

U.S. PATENT DOCUMENTS

| Re. 33,332 | 9/1990 | Furuya et al. | 371/37.4 |
|---|---|---|---|
| 4,546,474 | 10/1985 | Sako et al. | 371/37.5 |
| 4,593,394 | 6/1986 | Tomimitsu | 371/37.5 |
| 4,608,692 | 8/1986 | Nagumo et al. | 371/37.5 |
| 5,068,856 | 11/1991 | Nagasawa et al. | 371/37.5 |

FOREIGN PATENT DOCUMENTS

| 0136587 | 4/1985 | European Pat. Off. | 371/37.5 |
|---|---|---|---|
| 3128599 | 6/1982 | Fed. Rep. of Germany | |

OTHER PUBLICATIONS

Transactions on Communications, vol. 39, No. 12, Dec. 8, 1991; 'Closed solution of Berlekamp's algorithm for fast decoding of BCH codes'.

*Primary Examiner*—Charles E. Atkinson
*Attorney, Agent, or Firm*—Rothwell, Figg, Ernst & Kurz

[57] ABSTRACT

An error correction method and apparatus for correcting multiple errors in received digital data word signals calculates syndromes $S_0$, $S_1$, $S_2$ and $S_3$ from a block of n received data words and a parity check matrix H. First coefficients $\sigma_1$ and $\sigma_2$ are calculated from the derived syndromes and a second coefficient K is calculated from the first coefficients $\sigma_1$ and $\sigma_2$. An error location value $x_1$ is calculated from the second coefficient K, actual error location values $X_1$ and $X_2$ are calculated from the value $x_1$, and error values $Y_1$ and $Y_2$ are calculated from the actual error location values $X_1$ and $X_2$. The received data words are then corrected by applying the calculated error values $Y_1$ and $Y_2$. The error location value $x_1$ calculator is preferably constituted by logic gates which enable the apparatus to be smaller and faster than those using a conventional ROM table.

3 Claims, 3 Drawing Sheets

ERROR CORRECTION METHOD AND APPARATUS THEREOF

FIELD OF THE INVENTION

The present invention relates to an error correction technique, and more particularly to an error correction method and an apparatus thereof for protection of digital data, using an error correcting code in which up to two-word errors can be corrected.

BACKGROUND OF THE INVENTION

Generally, an error correction apparatus is applied to a digital communication system or a digital storage system, and can correct errors generated in the data to be received or to be reproduced.

As an example of the conventional error correction technique, there is a Japanese patent laid-open publication No. sho 57-25047 entitled "Error Correction Method" by SONY Corporation of Japan, published on Feb. 9, 1982. This publication discloses a method which can correct even two-word errors in a block of data having n words, each of which is composed of m bits.

The detailed descriptions are as follows.

The K syndromes $S_0$ to $S_{K-1}$ are obtained from a block of data $V^T$ consisting of n words to be received and a parity check matrix H by the following operation:

$$H \cdot V^T = \begin{bmatrix} S_o \\ S_1 \\ . \\ . \\ . \\ S_{K-2} \\ S_{K-1} \end{bmatrix}$$

Here, the parity check matrix H has n columns and k rows, and each of the elements in a predetermined row is selected among $\alpha^0 (=1)$ to $\alpha^{2m-2}$, where the element $\alpha$ is a root value satisfying the equation $F(X)=0$. Thus, two identical values are not found within the predetermined row, and the elements in the other rows are selected by the involution of the corresponding elements of the predetermined row. The parity check matrix H is represented as follows:

$$H = \begin{bmatrix} 1 & 1 & \ldots & 1 & 1 \\ \alpha^{n-1} & \alpha^{n-2} & \ldots & \alpha & 1 \\ \alpha^{2(n-1)} & \alpha^{2(n-2)} & \ldots & \alpha^2 & 1 \\ . & . & \ldots & . & . \\ . & . & \ldots & . & . \\ . & . & \ldots & . & . \\ \alpha^{(k-1)(n-1)} & \alpha^{(k-1)(n-2)} & \ldots & \alpha^{k-1} & 1 \end{bmatrix}$$

In case of a double word error ei and ej, the equations for the syndromes $S_0$, $S_1$, $S_2$, $S_3$ are as follows:

$S_0 = ei + ej$ $S_1 = \alpha^i ei + \alpha^j ej$ $S_2 = \alpha^{2i} ei + \alpha^{2j} ej$ $S_3 = \alpha^{3i} ei + \alpha^{3j} ej.$ The above equations can be modified as follows:

$(\alpha^i S_0 + S_1)(\alpha^i S_2 + S_3) = (\alpha^i S_1 + S_2)^2.$

If the equation is again modified, the following error location polynomial is obtained:

$(S_0 S_2 + S_1^2)\alpha^{2i} + (S_1 S_2 + S_0 S_3)\alpha^i + (S_1 S_3 + S_2^2) = 0$ $S_0 S_2 + S_1^2 = A$ $S_1 S_2 + S_0 S_3 = B$ $S_1 S_3 + S_2^2 = C$ The error locations for two-word errors can be calculated by using the coefficients A, B, and C of the polynomial equation.

[1] In the case of no errors:

$A = B = C = 0$, $S_0 = 0$, $S_3 = 0$.

[2] In the case of a one-word error:

When $A = B = C = 0$, $S_0 \neq 0$, and $S_3 \neq 0$, a one-word error is determined. An error location i can be easily obtained from the equation $\alpha^i = S_1/S_0$, and an error correction can be made using $ei = S_0$.

[3] In the case of a two-word error:

In the case of an error of two words or more, the relationships of $A \neq 0$, $B \neq 0$ and $C \neq 0$ are satisfied. At this time, the following relationship is satisfied:

$A\alpha^{2i} + B\alpha^i + C = 0$ in which i ranges from zero to $n-1$.

If it is assumed that the relationships of $B/A = D$ and $C/A = E$ are satisfied, the following equations are obtained:

$D = \alpha^i + \alpha^j$ $E = \alpha^i \alpha^j.$

Accordingly, the following equation is derived from the above equations:

$\alpha^{2i} + D\alpha^i + E = 0.$

Here, when the difference of two error locations is t, that is, when the relationship of $j = i + t$ is satisfied, the following equations are obtained:

$D = \alpha^i(1 + \alpha^t)$ $E = \alpha^{2i+t}.$

Whereby, the following equation can be further derived:

$$\frac{D^2}{E} = \frac{(1 + \alpha^t)^2}{\alpha^t} = \alpha^{-t} + \alpha^t$$

The values of $\alpha^{-t} + \alpha^t$ for $t = 1$ to $(n-1)$ are previously stored in ROM, and t is obtained by detecting an agreement between an output of ROM and a value of $D^2/E$ calculated from the received word. If there is no agreement, the error is determined to be three words or more.

Thus, the following relationships are assumed:

$$X = 1 + \alpha^i$$

$$Y = 1 + \alpha^{-i} = \frac{D^2}{E} + X$$

Through derivation, the following equations are true:

$$\alpha^i = \frac{D}{X}$$

$$\alpha^j = \frac{D}{Y}$$

From the above equations, the error locations i and j are obtained. Then, the error patterns ei and ej are represented as follows:

$$ei = \frac{(\alpha^i S_0 + S_1)}{D} = \frac{S_0}{Y} = \frac{S_1}{D}$$

$$ej = \frac{(\alpha^i S_0 + S_1)}{D} = \frac{S_0}{X} = \frac{S_1}{D}$$

The error locations and error patterns are obtained through the above-mentioned process, so that the error of the received word at the corresponding error locations can be corrected according to the error patterns.

However, in the method proposed in the Japanese patent laid-open publication No. Sho 57-25047, in order to obtain the error locations, the error locator polynomial $\alpha^{2i} + D\alpha^i + E = 0$ is solved to obtain two roots $\alpha^i$, $\alpha^j$ from which the error locations i and j are obtained, making the circuit required for the operations overly complicated, and the operational delay time overly long.

SUMMARY OF THE INVENTION

Accordingly, it is an object of the present invention to provide an error correction method which can obtain error values without the step for calculating an error location polynomial.

It is another object of the present invention to provide an error correction apparatus which has a shorter delay time and a more simplified circuit.

To achieve the objects, an error correction method of the present invention comprises the steps of:

obtaining four syndromes $S_0$, $S_1$, $S_2$ and $S_3$ using the following operation of a block data $V^T$ composed of n received words and a parity check matrix H $$H \cdot V^T = \begin{bmatrix} S_0 \\ S_1 \\ S_2 \\ S_3 \end{bmatrix};$$

determining no errors when the syndromes $S_0$, $S_1$, $S_2$ and $S_3$ satisfy $S_0 = S_1 = S_3 = 0$:

calculating $D = S_0 S_2 + S_1^2$ from the syndromes $S_0$, $S_1$, $S_2$ and $S_3$ and determining whether D is equal to zero;

calculating the following coefficients $\sigma_1$ and $\sigma_2$, if D is not equal to zero:

$$\sigma_1 = \frac{S_0 S_3 + S_1 S_2}{D}$$

$$\sigma_2 = \frac{S_1 S_3 + S_2^2}{D}$$

obtaining the following coefficient K and the value Tr(K), when the coefficients $\sigma_1$ and $\sigma_2$ are not equal to zero:

$$K = \frac{\sigma_2}{\sigma_1^2}$$

$$= k_o + k_1\alpha + k_2\alpha^2 + k_3\alpha^3 + k_4\alpha^4 + k_5\alpha^5 +$$

$$k_6\alpha^6 + k_7\alpha^7$$

$$Tr(K) = k_0 Tr(1) + k_1 Tr(\alpha) + k_2 Tr(\alpha^2) + k_3 Tr(\alpha^3) + k_4 Tr(\alpha^4) +$$

$$k_5 Tr(\alpha^5) + k_6 Tr(\alpha^6) + k_7 Tr(\alpha^7)$$

obtaining the following error locations $X_1$ and $X_2$ from the coefficient K:

$$X_1 = X_1 \sigma_1$$

$$X_2 = (1 + X_1)\sigma_1$$

where, from $Tr(\alpha^5) = 1$, the following is derived:

$$X_1 = [k_0, k_1, k_2, k_3, k_4, k_5, k_6, k_7] \begin{bmatrix} 01101011 \\ 00010111 \\ 01010111 \\ 10110100 \\ 01110111 \\ 10000000 \\ 10100100 \\ 00001010 \end{bmatrix}$$

$$= (X_0, X_1, X_2, X_3, X_4, X_5, X_6, X_7)$$

obtaining the following error values $Y_1$ and $Y_2$ from the error locations $X_1$ and $X_2$:

$$Y_1 = \frac{S_0 X_2 + S_1}{X_1 + X_2}$$

$$Y_2 = \frac{S_0 X_1 + S_1}{X_1 + X_2},$$

thereby correcting two-word errors where $K \in GF(2^8)$.

An error correction apparatus of the present invention to achieve the other object of the present invention comprises:

a syndrome calculator for calculating syndromes $S_0$, $S_1$, $S_2$ and $S_3$ from n received words;

a first coefficient calculator for calculating the following coefficients $\sigma_1$ and $\sigma_2$ from the syndromes $$\sigma_1 = \frac{S_0 S_3 + S_1 S_2}{D}$$

$$\sigma_2 = \frac{S_1 S_3 + S_2^2}{D}$$

a second coefficient calculator for calculating the following coefficient K from the coefficients $\sigma_1$ and $\sigma_2$ $$K = \frac{\sigma_2}{\sigma_1^2}$$

an $X_1$ value calculator for calculating a value $X_1$ from the coefficient K;

an error location value calculator for calculating the following error locations $X_1$ and $X_2$ from the value $X_1$ $$X_1 = X_1 \sigma_1$$

$$X_2 = (1+X_1)\sigma_1$$

an error value calculator for receiving the error location values $X_1$ and $X_2$ and then calculating the following error values $Y_1$ and $Y_2$ $$Y_1 = \frac{S_0 X_2 + S_1}{X_1 + X_2}$$

$$Y_2 = \frac{S_0 X_1 + S_1}{X_1 + X_2}$$

an error discriminator for determining how many errors happen, wherein the $x_1$ value calculator uses XOR logic gates which satisfy the following equations:

$$x_0 = k_3 + k_5 + k_6$$

$$x_1 = k_0 + k_2 + k_4$$

$$x_2 = k_0 + k_3 + k_4 + k_6$$

$$x_3 = k_1 + k_2 + k_3 + k_4$$

$$x_4 = k_0 + k_7$$

$$x_5 = k_1 + k_2 + k_3 + k_4 + k_6$$

$$x_6 = k_0 + k_1 + k_2 + k_4 + k_7$$

$$x_7 = k_0 + k_1 + k_2 + k_4.$$

BRIEF DESCRIPTION OF THE DRAWINGS

The above objects and other advantages of the present invention will become more apparent by describing the preferred embodiment of the present invention with reference to the attached drawings, in which.

DETAILED DESCRIPTION OF THE INVENTION

Figure 1:
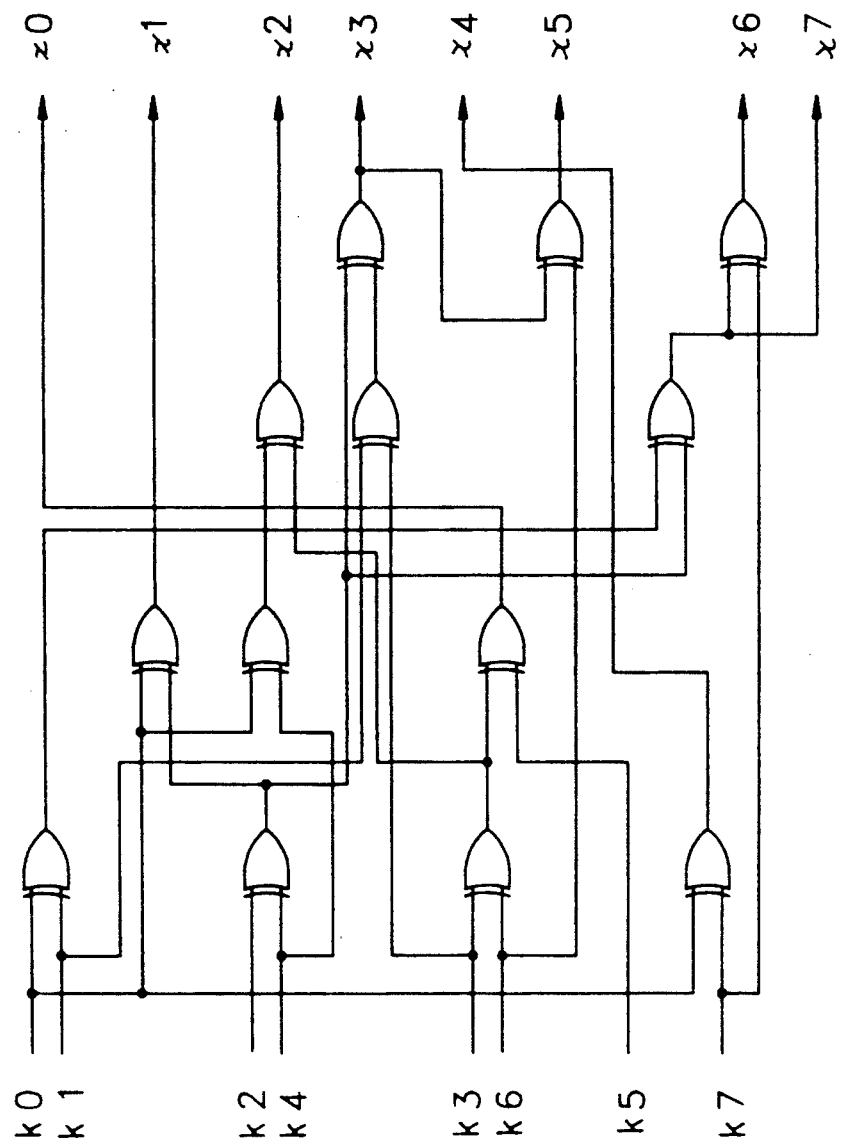
FIG. 1 is a logic circuit diagram to be applied to a preferred embodiment of the error correction apparatus according to the present invention.

First of all, an error correction code used in the present invention will be explained.

If an element $\lambda [\lambda \in GF(q^m)]$ to be $\theta = \lambda - \lambda^q$ exists, from the following propositions:

$$Tr(\theta) = \sum_{k=0}^{m-1} \theta^{q^k}$$

$$Tr(\alpha + \beta) = Tr(\alpha) + Tr(\beta); \alpha, \beta \in GF(q^m)$$

$$Tr(\alpha) = Tr(\alpha^2)$$

$$Tr(C\alpha) = CTr(\alpha); \alpha \in GF(q^m)$$

the following equation is obtained:

$$Tr(\theta) = 0.$$

If $\gamma \in GF(q^m)$ and $\theta \in GF(q^m)$ are satisfied, the following equations are obtained:

$$\lambda = \theta \gamma^q + (\theta + \theta^q)\gamma^{q^2} + \ldots + (\theta + \theta^q + \ldots + \theta^{q^{m-2}})\gamma^{q^{m-1}} \quad (1)$$

$$\lambda - \lambda^q = \theta(Tr(\gamma) - \gamma) - \gamma(Tr(\theta) - \theta) \quad (2)$$

Thus, when an element over $GF(q^m)$ satisfying $Tr(\lambda) = 1$ is selected and $Tr(\theta)$ is equal to zero, the element $\lambda$ defined in Eq. (1) satisfies $\theta = \lambda - \lambda$ from Eq. (2). Thus, if we infer $x^2 + x = K$ from the error location polynomial $\sigma(x) = x^2 + x + K$ and assume that x and K respectively correspond to $\lambda$ and $\theta$ of the propositions, then, where $Tr(\theta) = 0$, the roots of the error location polynomial $\sigma(x)$ are obtained, and the value x is represented as in Eq. (1).

Also, K can be given as $$K = k_0 k_1 \alpha + k_2 \alpha^2 + k_3 \alpha^3 + k_4 \alpha^4 + k_5 \alpha^5 + k_6 \alpha^6 + k_7 \alpha^7$$

and taking the traces for both sides of $K \in GF(2^m)$, it is given as $$Tr(K) = k_0 Tr(1) + k_1 Tr(\alpha) + k_2 Tr(\alpha^2) + k_3 Tr(\alpha^3) + k_4 Tr(\alpha^4) + k_5 Tr(\alpha^5) + k_6 Tr(\alpha^6) + k_7 Tr(\alpha^7) \quad (3).$$

Using $$Tr(\beta) = \sum_{k=0}^{m-1} \beta^{q^k}$$

and $\beta \in GF(q^m)$ from the above-mentioned propositions to calculate the trace values of both sides of Eq.(3), they are given as:

$$Tr(1) = Tr(\alpha) = Tr(\alpha^2) = Tr(\alpha^3) = Tr(\alpha^4)$$
$$= Tr(\alpha^6) = Tr(\alpha^7) = 0,$$

and then $Tr(\alpha^5)$ becomes "1".

As a result, the value Tr(K) becomes zero only when $K_5$ becomes zero, so that there exists roots of the error location polynomial $\sigma(x)$. That is, if the propositions establish Tr(K) to be zero, there exists a value x over $GF(q^m)$ satisfying $x^2 + x = K$. Here, if $K \in GF(2^8)$ and $Tr(K) = K_5 = 0$ is satisfied, one root is obtained using the following method.

i) An element K satisfying $Tr(K) = 1$ is $\alpha^5$, which is proven as follows:

$$Tr(\alpha^5) = \sum_{k=0}^{7} (\alpha^5)^{2k}$$
$$= \alpha^5 + (\alpha^5)^2 + (\alpha^5)^4 + \ldots + (\alpha^5)^{128}$$
$$= 1.$$

ii) For $Tr(K)=0$, x is obtained as in Eq. (1), that is, $$x = \theta\gamma^2 + (\theta + \theta^2)\gamma^4 + (\theta + \theta^2 + \theta^4)\gamma^8 + (\theta + \theta^2 + \theta^4 + \quad (4)$$
$$\theta^8)\gamma^{16} + (\theta + \theta^2 + \theta^4 + \theta^8 + \theta^{16})\gamma^{32} + (\theta + \theta^2 + \theta^4 + \theta^8 +$$
$$\theta^{16} + \theta^{32})\gamma^{64} + (\theta + \theta^2 + \theta^4 + \theta^8 + \theta^{16} + \theta^{32} + \theta^{64})\gamma^{128}$$

Rewriting Eq. (4) with respect to $\theta$, x is given as:

$$x = (\gamma^2 + \gamma^4 + \gamma^8 + \gamma^{16} + \gamma^{32} + \gamma^{64} + \gamma^{128})\theta + (\gamma^4 + \gamma^8 \quad (5)$$
$$+ \gamma^{16} + \gamma^{32} + \gamma^{64} + \gamma^{128})\theta^2 + (\gamma^8 + \gamma^{16} + \gamma^{32} + \gamma^{64} +$$
$$\gamma^{128})\theta^4 + (\gamma^{16} + \gamma^{32} + \gamma^{64} + \gamma^{128})\theta^8 + (\gamma^{32} + \gamma^{64} + \gamma^{128})\theta^{16} +$$
$$(\gamma^{64} + \gamma^{128})\theta^{32} + \gamma^{128}\theta^{64}$$

iii) Substituting $\gamma = \alpha^5$ into Eq. (5), the respective coefficients can be obtained from $$x = (1 + \alpha^5)\theta + (1 + \alpha^2 + \alpha^4 + \alpha^6)\theta^2 + (1 + \alpha^5 + \alpha^6 + \quad (6)$$
$$\alpha^7)\theta^3 + (1 + \alpha + \alpha^3 + \alpha^7)\theta^4 + (\alpha + \alpha^2 + \alpha^4 + \alpha^5 + \alpha^6)\theta^5 +$$
$$(\alpha^4 + \alpha^7)\theta^{32} + (\alpha + \alpha^2 + \alpha^3 + \alpha^5)\theta^{64}$$

iv) Each value x for $\theta = 1$ to $\alpha^7$ is obtained.

1) $\theta = 1$;
   $x = \alpha + \alpha^2 + \alpha^4 + \alpha^6 + \alpha^7$
   $= (01101011)$ 2) $\theta = \alpha$;
   $x = \alpha^3 + \alpha^5 + \alpha^6 + \alpha^7$
   $= (00010111)$ 3) $\theta = \alpha^2$;
   $x = \alpha + \alpha^3 + \alpha^5 + \alpha^6 + \alpha^7$
   $= (01010111)$ 4) $\theta = \alpha^3$;
   $x = 1 + \alpha^2 + \alpha^3 + \alpha^5$
   $= (10110100)$ 5) $\theta = \alpha^4$;
   $x = \alpha + \alpha^2 + \alpha^3 + \alpha^5 + \alpha^6 + \alpha^7$
   $= (01110111)$ 6) $\theta = \alpha^5$;
   $x = 1$
   $= (10000000)$ 7) $\theta = \alpha^6$;
   $x = 1 + \alpha^2 + \alpha^5$
   $= (10100100)$ 8) $\theta = \alpha^7$;
   $x = \alpha^4 + \alpha^6$
   $= (00001010)$ v) Considering the matrix equation obtained from step iv is:

$$K = \sigma_2/\sigma_1^2 \quad (7)$$
$$= (k_0, k_1, k_2, k_3, k_4, k_5, k_6, k_7)$$

then the following is true:

$$X_1 = [k_0, k_1, k_2, k_3, k_4, k_5, k_6, k_7] \begin{bmatrix} 01101011 \\ 00010111 \\ 01010111 \\ 10110100 \\ 01110111 \\ 10000000 \\ 10100100 \\ 00001010 \end{bmatrix} \quad (8)$$

$$= (x_0, x_1, x_2, x_3, x_4, x_5, x_6, x_7)$$

From $$X_1 = K \times M,$$

and $$X_1 = (x_0, x_1, x_2, x_3, x_4, x_5, x_6, x_7)$$

$$K = (k_0, k_1, k_2, k_3, k_4, k_5, k_6, k_7)$$

rewriting Eq. (6), M is given as $$M = \begin{bmatrix} x|\theta = \alpha^0 = 1 \\ x|\theta = \alpha^1 \\ \cdot \\ \cdot \\ \cdot \\ x|\theta = \alpha^7 \end{bmatrix}$$

Thus, a root $X_1$ of $x^2 + x = K$ can be obtained. At this time, each value of component elements $x_0$ to $x_7$ of $X_1$ is given from Eq. (8) as $$\begin{aligned} x_0 &= k_3 + k_5 + k_6 \\ x_1 &= k_0 + k_2 + k_4 \\ x_2 &= k_0 + k_3 + k_4 + k_6 \\ x_3 &= k_1 + k_2 + k_3 + k_4 \\ x_4 &= k_0 + k_7 \\ x_5 &= k_1 + k_2 + k_3 + k_4 + k_6 \\ x_6 &= k_0 + k_1 + k_2 + k_4 + k_7 \\ x_7 &= k_0 + k_1 + k_2 + k_4 \end{aligned} \quad (9)$$

Here, $k_5$ should be "0" to satisfy the above-mentioned $Tr(K) = k_5 = 0$.

Thus completing the method for obtaining the root $X_1$, the other root $X_2$ is obtained from $X_2 = X_1 + 1$.

Since the actual error locations can be obtained from multiplying each of $X_1$ and $X_2$ by $\sigma_1$, they are given as $$\begin{aligned} X_1 &= X_1 \sigma_1 \\ X_2 &= X_2 \sigma_1 \end{aligned} \quad (10)$$

-continued where, $$\sigma_1 = \frac{S_0 S_3 + S_1 S_2}{S_0 S_2 + S_1^2}.$$

Also, the error values $Y_1$ and $Y_2$ are determined as:

$$\left. \begin{array}{l} Y_1 = \dfrac{S_0 X_2 + S_1}{X_1 + X_2} \\ Y_2 = \dfrac{S_0 X_1 + S_1}{X_1 + X_2} \end{array} \right] \quad (11)$$

FIG. 1 shows a logic circuit diagram using XOR gates for implementing Eq. (9). Then, substituting $x = \sigma_1 x'$ into the double error location polynomial $\sigma(x) = x^2 + \sigma_1 x + \sigma_2$ yields $$\sigma(x') = x'^2 + x' + K$$

Then, $K = \sigma_2/\sigma_1^2$ of Eq. (7) is obtained.

Figure 2:
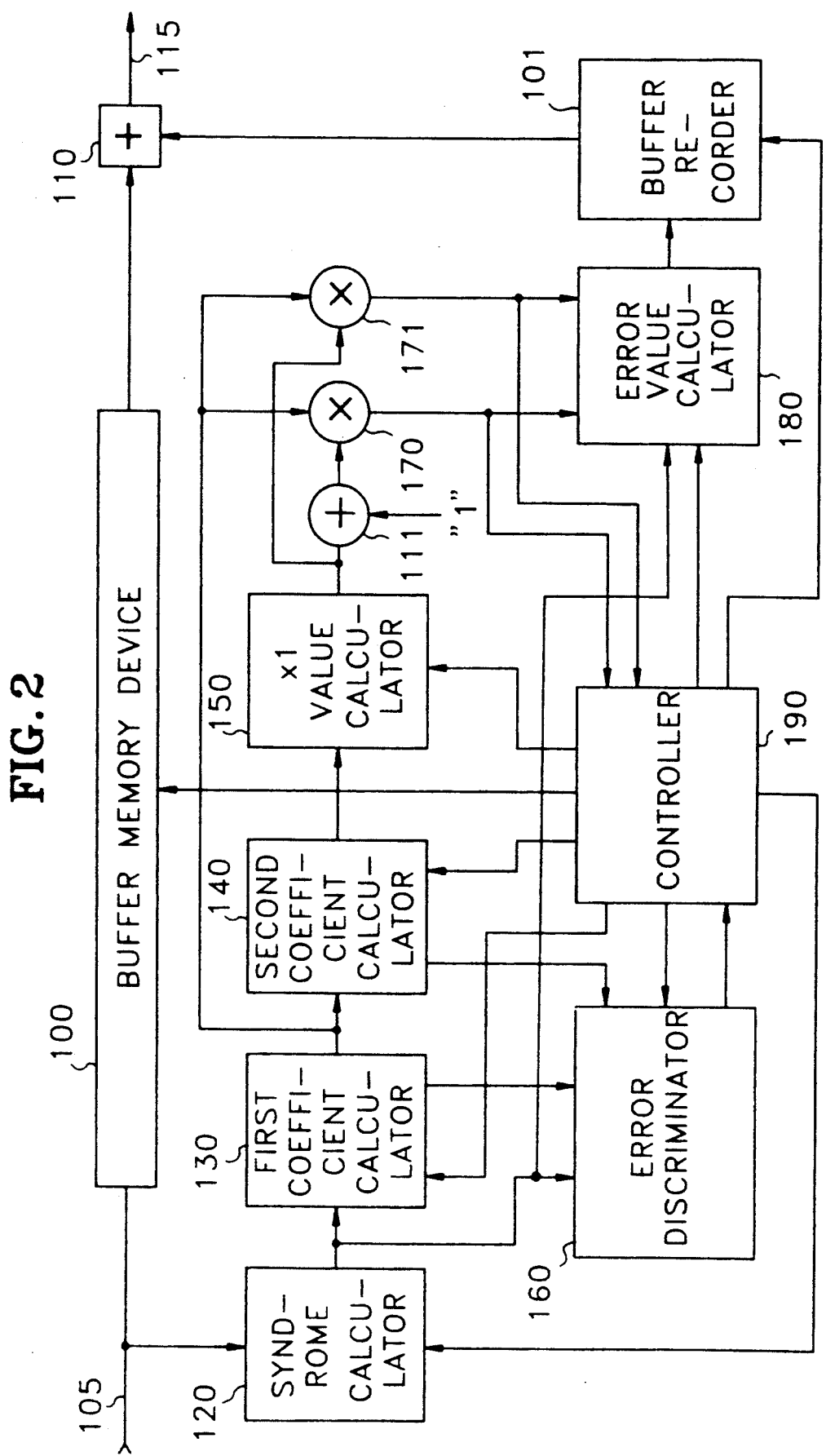
FIG. 2 is a block diagram of the preferred embodiment of the error correction apparatus according to the present invention.

FIG. 2 is a block diagram of a preferred embodiment of an error correction apparatus according to the present invention.

With reference to FIG. 2, an input terminal 105 indicates an input for received data, and is connected to the inputs of a buffer memory device 100 and a syndrome calculator 120. The output of the buffer memory device 100 is connected to a first input of a first adder 110 which in turn outputs via an output terminal 115. The output of the syndrome calculator 120 is connected to a third input terminal of an error value calculator 180, a first input of a first coefficient calculator 130 and a first input of an error discriminator 160. A first output terminal of the first coefficient calculator 130 is connected to an input of a second coefficient calculator 140, the first input terminal of the first adder 110, and a first input terminal of a second multiplier 171. A second output of the first coefficient calculator 130 is connected to a second input of the error discriminator 160. A second output of the second coefficient calculator 140 is connected to a third input of the error discriminator 160. The output of the error discriminator 160 is connected to a first input of a controller 190. The output of an error location calculator 150 is connected to a first input of a second adder 111 and a second input of a first multiplier 170. The output of the second adder 111 is connected to a second input of the second multiplier 171. The output of the first multiplier 170 is connected to a second input of the error value calculator 180 and a second input of the controller 190. The output of the second multiplier 171 is connected to a third input of the error value calculator 180 and a third input of the controller 190. The output of the error value calculator 180 is connected to a first input of a buffer recorder 101. The output of the buffer recorder 101 is connected to a second input of the first adder 110. An output of the first adder 110 is connected to an output 115. First to eighth output terminals of the controller 190 are connected to control inputs of the buffer memory device 100, the syndrome calculator 120, the first coefficient calculator 130, the second coefficient calculator 140, the error location calculator 150, the error discriminator 160, the error value calculator 180, and the buffer recorder 101, respectively.

The operation of the error correction apparatus shown in FIG. 2 will be explained with reference to FIG. 1.

The received data fed through the input terminal 105 is simultaneously supplied to the buffer memory device 100 and the syndrome calculator 120.

The buffer device 100 delays the received data fed through the input terminal 105 for the required processing time of the syndrome calculator 120, the first and second coefficient calculators 130 and 140, the error location calculator 150, the second adder 111, the first and second multipliers 170 and 171, the error value calculator 180, and the buffer recorder 101, and then supplies the delayed received data to the first input of the first adder 110.

The syndrome calculator 120 stores the received data fed in series from input terminal 105 in its memory, and when the input of received data corresponding to a block has been completed, then the syndromes $S_0$, $S_1$, $S_2$ and $S_3$ are calculated using the following equation:

$$H \cdot V^T = \begin{bmatrix} S_0 \\ S_1 \\ S_2 \\ S_3 \end{bmatrix}$$

The first coefficient calculator 130 produces coefficients $\sigma_1$, $\sigma_2$ and D using the following operation of the syndromes $S_0$ through $S_3$ received from the syndrome calculator 120:

$$\sigma_1 = \frac{S_0 S_3 + S_1 S_2}{S_1^2 + S_0 S_2}$$

$$\sigma_2 = \frac{S_1 S_3 + S_2^2}{S_1^2 + S_0 S_2}$$

$$D = S_1^2 + S_0 S_2$$

Then, the first coefficient calculator 130 supplies the two coefficients $\sigma_1$, $\sigma_2$ to the second coefficient calculator 140 and the first and second multipliers 170 and 171 through the first output terminal, and supplies the coefficient D to the error discriminator 160 through the second output terminal. Here, the two coefficients $\sigma_1$ and $\sigma_2$ are coefficients of the quadratic error location polynomial $\sigma(y) = y^2 + \sigma_1 y + \sigma_2 = 0$.

The second coefficient calculator 140 calculates the third coefficient K using the following operation of the two coefficients $\sigma_1$ and $\sigma_2$ received from the first coefficient calculator 130:

$$K = \frac{\sigma_2}{\sigma_1^2}$$

and then, via the first output, supplies the calculated coefficient K to the error location calculator 150.

The error location calculator 150 supplies the first error location value $x_1$ to the second adder 111 and the second multiplier 171 by the circuit shown in FIG. 1. The second adder 111 adds "1" to the first error location value $x_1$ to supply the second error location value $x_2$ to the first multiplier 170. The first multiplier 170 multiplies the second error location value $x_2$ by the first coefficient $\sigma_1$ to supply it to the error value calculator

180. The second multiplier 171 multiplies the first error location value $x_1$ by the second coefficient $\sigma_2$ to supply it to the error value calculator 180. The error value calculator 180 calculates the error value $Y_1$ and $Y_2$ using the first error location value $X_1$ and the second error location value $X_2$ as shown below:

$$Y_1 = \frac{S_0 X_2 + S_1}{X_1 + X_2}$$

$$Y_2 = \frac{S_0 X_1 + S_1}{X_1 + X_2}$$

and then supplies the error values $Y_1$ and $Y_2$ to the buffer recorder 101.

The buffer recorder 101 stores the two error values $Y_1$ and $Y_2$ received from the error value calculator 180. Then, when the received word having the error is supplied to the first input of the first adder 110, the buffer recorder 101 supplies the error values $Y_1$ and $Y_2$ to the second input of the first adder 110.

The first adder 110 adds the error values $Y_1$ and $Y_2$ fed to the second input terminal from the buffer recorder 101 to the received data fed to the first input terminal from the buffer memory device 100 and then corrects errors generated in received data.

The error discriminator 160 checks the syndromes $S_0$ through $S_3$ received from the syndrome calculator 120, the coefficient D received from the first coefficient calculator 130, and the value received from the second coefficient calculator 140, and then determines the existence or the absence of an error, the generation of one word error, the generation of a double word error, or the generation of a triple word error or greater.

The controller 190 supplies control signals for normalized timing to the buffer memory device 100, the syndrome calculator 120, the first and second coefficient calculators 130 and 140, the K value calculator 150, the error discriminator 160, the error value calculator 180 and the buffer recorder 101, respectively.

Figure 3:
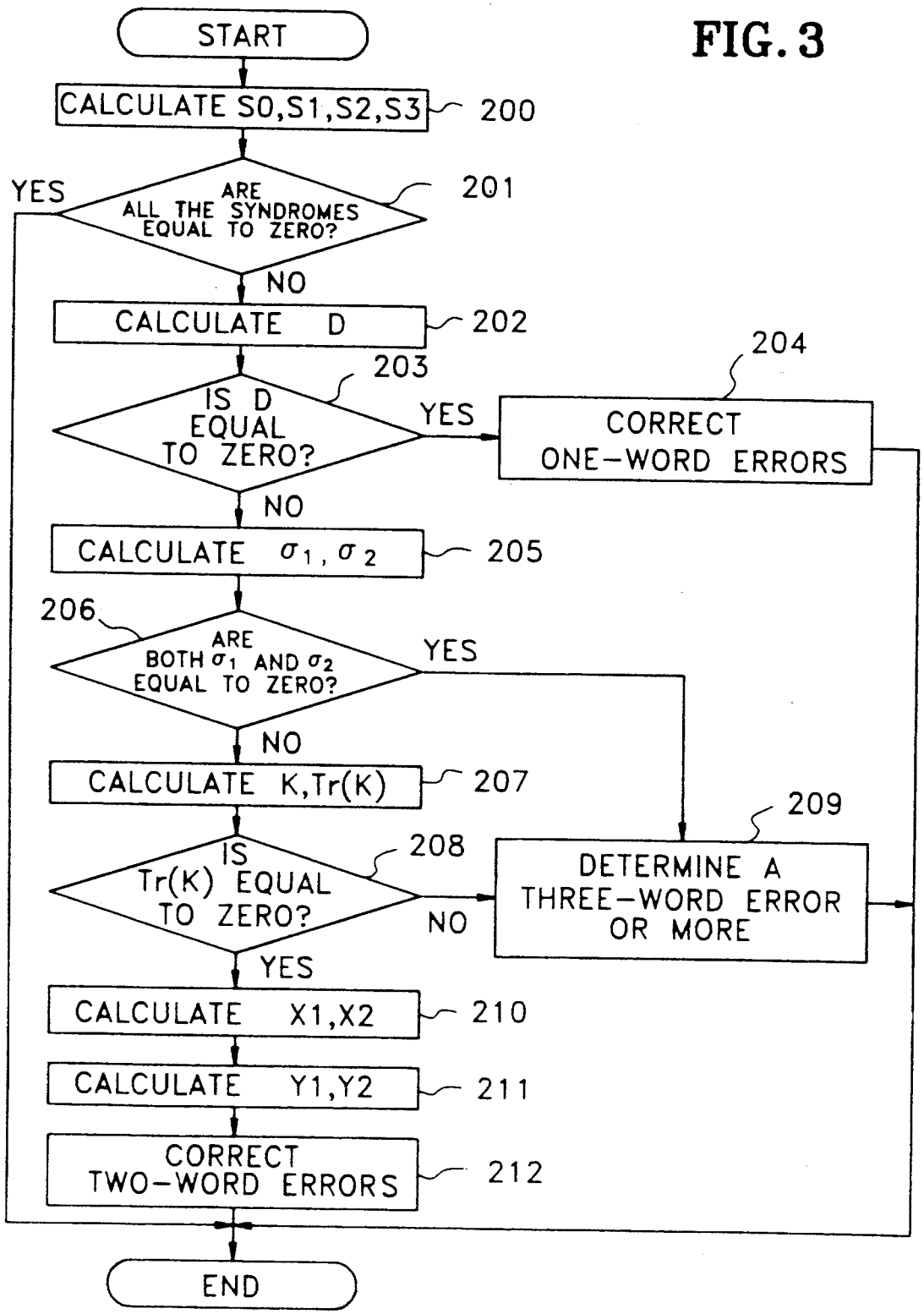
FIG. 3 is a flowchart illustrating the operation of the apparatus shown in FIG. 2.

The operation of the apparatus shown in FIG. 2 will be described in detail according to the operational flowchart shown in FIG. 3.

The controller 190 supplies a syndrome calculation control signal to the syndrome calculator 120, instructing it to calculate syndromes (in step 200).

After step 200, the controller 190 queries the error discriminator 160 by way of an error discrimination control signal to determine whether the syndromes are all zero. If at this time, when the discrimination result signal received back from the error discriminator 160 shows that $S_0 = S_1 = S_2 = S_3 = 0$, the controller 190 recognizes a no-error condition and then terminates the error correction operation (in step 201).

When the discrimination result signal fed to the error discriminator 160 shows that one or more syndromes are unequal to zero in the step 201, the controller 190 supplies the coefficient calculation control signal to the first coefficient calculator 130, instructing the first coefficient calculator to calculate D (in step 202), and also supplies the error discrimination control signal to the error discriminator 160, instructing the error discriminator to determine whether D is equal to zero (in step 203).

If the discrimination result signal received from the error discriminator 160 shows D=0, the controller 190 controls the error value calculator 180 and the buffer recorder 101 to correct one-word errors (in step 204).

And, if the discrimination result signal shows that D≠0, the controller 190 instructs the first coefficient calculator 130 to calculate the two coefficients $\sigma_1$ and $\sigma_2$ of the quadratic error location polynomial $\sigma(y) = y^2 + \sigma_1 y + \sigma_2 = 0$ (in step 205).

Step 206 determines whether the discrimination result signal from the error discriminator 160 shows that $\sigma_1 = 0$ and $\sigma_2 = 0$. If the discrimination result signal received in the error discriminator 160 shows that $\sigma_1 = 0$ or $\sigma_2 = 0$, it is determined there are three or more errors (in step 209). And if the discrimination result signal shows that $\sigma_1 \neq 0$ and $\sigma_2 \neq 0$, the controller 190 supplies a control signal, instructing the second coefficient calculator 140 to calculate K and Tr(K) (in step 207).

After the step 207, it is determined whether the discrimination result signal received in the error discriminator 160 satisfies Tr(K)=0 (in step 208). If the discrimination result signal received in the error discriminator 160 shows that Tr(K) is not equal to zero, the controller 190 recognizes the generation of the three or more errors (in step 209). And if the discrimination result signal received in the error discriminator 160 shows that Tr(K) is equal to zero, the controller 190 instructs the $X_1$ value calculator 150 to calculate the value $X_1$. Also in same step (step 210), the first multiplier 170 multiplies the value $X_1$ by the value $\sigma_1$ to calculate the value $X_1$, and the second multiplier 171 multiplies the value $X_2$ by the value $\sigma_2$ to calculate the value $X_2$ (in step 210).

After step 210, the controller 190 supplies a control signal to the error value calculator 180, instructing it to calculate the error values $Y_1$ and $Y_2$ (in step 211).

After the step 211, the controller 190 controls the buffer recorder 101 according to the error location values $X_1$ and $X_2$ received from the first and second multipliers 170 and 171 in the step 210, thereby making the buffer recorder 101 supply the stored error values $Y_1$ and $Y_2$ received from the error value calculator 180 to the first adder 110. At this time, the first adder 110 adds the error values received from the buffer recorder 101 to the received word having the error and received from the buffer memory device 100, thereby correcting two-word errors in the received word (in step 211).

According to the present invention, the method and the apparatus used for correcting double errors over $GF(2^8)$, receives the value from the second coefficient value calculator 140, and outputs the data using the XOR gates shown in FIG. 1, thereby being faster and simpler, and also having a smaller chip size than that using the conventional ROM table.

What is claimed is:

1. An error correction method for correcting errors in received digital data signals, comprising the steps of:

obtaining four syndromes $S_0$, $S_1$, $S_2$ and $S_3$ by operating on a block of data $V^T$ composed of n received digital data words with a parity check matrix H such that $$H \cdot V^T = \begin{bmatrix} S_0 \\ S_1 \\ S_2 \\ S_3 \end{bmatrix};$$

determining no errors when said syndromes $S_0$, $S_1$, $S_2$ and $S_3$ satisfy $S_0 = S_1 = S_2 = S_3 = 0$;

calculating $D = S_0 S_2 + S_1^2$ from said syndromes $S_0$, $S_1$, $S_2$ and $S_3$ and determining whether D is equal to zero;

calculating the following coefficients $\sigma_1$ and $\sigma_2$, if D is not equal to zero:

$$\sigma_1 = \frac{S_0 S_3 + S_1 S_2}{D}$$

$$\sigma_2 = \frac{S_1 S_3 + S_2^2}{D}$$

obtaining the following coefficient K and the value Tr(K), when said coefficients $\sigma_1$ and $\sigma_2$ are not equal to zero:

$$K = \frac{\sigma_2}{\sigma_1^2}$$
$$= k_0 + k_1 \alpha + k_2 \alpha^2 + k_3 \alpha^3 + k_4 \alpha^4 + k_5 \alpha^5 + k_6 \alpha^6 + k_7 \alpha^7$$

$$Tr(K) = k_0 TR(1) + k_1 Tr(\alpha) + k_2 TR(\alpha^2) + k_3 Tr(\alpha^3) + k_4 Tr(\alpha^4) + k_5 Tr(\alpha^5) + k_6 Tr(\alpha^6) + k_7 Tr(\alpha^7)$$

obtaining the following error locations $X_1$ and $X_2$ from said coefficient K:

$X_1 = x_1 \sigma_1$ $X_2 = (1 + x_1) \sigma_1$ where, from $Tr(\alpha^5) = 1$, the following is derived:

$$x_1 = [k_0, k_1, k_2, k_3, k_4, k_5, k_6, k_7] \begin{bmatrix} 01101011 \\ 00010111 \\ 01010111 \\ 10110100 \\ 01110111 \\ 10000000 \\ 10100100 \\ 00001010 \end{bmatrix}$$

$$= (X_0, X_1, X_2, X_3, X_4, X_5, X_6, X_7)$$

obtaining the following error values $Y_1$ and $Y_2$ from said error locations $X_1$ and $X_2$:

$$Y_1 = \frac{S_0 X_2 + S_1}{X_1 + X_2}$$

$$Y_2 = \frac{S_0 X_1 + S_1}{X_1 + X_2}$$

and correcting two-word errors where $K \in GF(2^8)$ by adding said error values $Y_1$ and $Y_2$ to said received digital data word signals.

2. An error correction apparatus for correcting errors in received digital data signals, comprising:

a syndrome calculator for calculating syndromes $S_0$, $S_1$, $S_2$, and $S_3$ from n received digital data words;

a first coefficient calculator for calculating coefficients $\sigma_1$ and $\sigma_2$ from said syndromes according to the equations:

$$\sigma_1 = \frac{S_0 S_3 + S_1 S_2}{D}$$

$$\sigma_2 = \frac{S_1 S_3 + S_2^2}{D}$$

a second coefficient calculator for calculating a coefficient K from said coefficients $\sigma_1$ and $\sigma_2$ according to the equation:

$$K = \frac{\sigma_2}{\sigma_1^2} = [k_0, k_1, \ldots, k_7],$$

where $K \in GF(2^8)$;

an $x_1$ value calculator for calculating a value $x_1$ from the coefficient K;

an error location value calculator for calculating the following error locations $X_1$ and $X_2$ from said value $x_1$ $X_1 = x_1 \sigma_1$ $X_2 = (1 + x_1) \sigma_1$ an error value calculator for receiving said error location values $X_1$ and $X_2$ and then calculating the following error values $Y_1$ and $Y_2$ $$Y_1 = \frac{S_0 X_2 + S_1}{X_1 + X_2}$$

$$Y_2 = \frac{S_0 X_1 + S_1}{X_1 + X_2}$$

an error discriminator for determining how many errors exist in said received digital data; and an error corrector for correcting said determined errors by adding said error values $Y_1$ and $Y_2$ to said received digital data words;

wherein the $x_1$ value calculator uses XOR logic gates which satisfy the following equations:

$X_0 = k_3 + k_5 + k_6$ $X_1 = k_0 + k_2 + k_4$ $X_2 = k_0 + k_3 + k_4 + k_6$ $X_3 = k_1 + k_2 + k_3 + k_4$ $X_4 = k_0 + k_7$ $X_5 = k_1 + k_2 + k_3 + k_4 + k_6$ $X_6 = k_0 + k_1 + k_2 + k_4 + k_7$ $X_7 = k_0 + k_1 + k_2 + k_4$ in which $x_1 = [X_0, X_1, X_2, \ldots, X_7]$.

3. An error correction apparatus as claimed in claim 2, wherein said logic gates are XOR gates.

* * * * *